(12) United States Patent
Pillonnet et al.

(10) Patent No.: US 7,961,047 B2
(45) Date of Patent: Jun. 14, 2011

(54) SWITCHING AMPLIFIER

(75) Inventors: Gaël Pillonnet, Villeurbanne (FR);
Remy Cellier, Grenoble (FR)

(73) Assignees: STMicroelectronics (Grenoble) SAS,
Grenoble (FR); **STMicroelectronics
SAS**, Rousset (FR)

( * ) Notice: Subject to any disclaimer, the term of this patent is extended or adjusted under 35 U.S.C. 154(b) by 0 days.

(21) Appl. No.: 12/781,552

(22) Filed: May 17, 2010

(65) Prior Publication Data
US 2010/0290646 A1 Nov. 18, 2010

Related U.S. Application Data

(63) Continuation of application No. 12/393,524, filed on Feb. 26, 2009, now abandoned.

(30) Foreign Application Priority Data

Feb. 29, 2008 (EP) .................................... 08300125

(51) Int. Cl.
*H03F 21/00* (2006.01)
(52) U.S. Cl. .................................... 330/207 A; 330/251
(58) Field of Classification Search ............... 330/207 A, 330/251
See application file for complete search history.

(56) References Cited

U.S. PATENT DOCUMENTS

| 4,531,096 A | 7/1985 | Yokoyama |
| 4,775,841 A | 10/1988 | Trofimenkoff et al. |
| 5,160,896 A | 11/1992 | McCorkle |
| 5,345,165 A | 9/1994 | Froeschele |
| 5,451,900 A | 9/1995 | Haga et al. |
| 6,498,531 B1 | 12/2002 | Ulrick |
| 6,580,322 B2 * | 6/2003 | Miao et al. ................. 330/207 A |
| 6,998,911 B2 * | 2/2006 | Honda et al. .................... 330/10 |
| 7,113,038 B2 | 9/2006 | Putzeys |
| 7,425,864 B2 | 9/2008 | Risbo |

FOREIGN PATENT DOCUMENTS

WO WO 2008007308 A1 1/2008

OTHER PUBLICATIONS

European Search Report dated Aug. 14, 2008 from corresponding European Application No. 08300125.

* cited by examiner

*Primary Examiner* — Henry K Choe
(74) *Attorney, Agent, or Firm* — Lisa K. Jorgenson; James H. Morris; Wolf, Greenfield & Sacks, P.C.

(57) ABSTRACT

An amplifier having at least one switch controlled by an output voltage of a hysteresis block, wherein the hysteresis block is adapted to receive an input voltage signal based on an integration of an error signal, a low threshold voltage and a high threshold voltage, and is arranged to change the output voltage from a first value to a second value when the input voltage signal is higher than the high threshold voltage and to change the output voltage from the second value to the first value when the input voltage signal is lower than the low threshold voltage, and wherein the low threshold voltage is equal to $V_{ref}-\alpha V_{DD}$ and the high threshold voltage is equal to $V_{ref}+\alpha V_{DD}$, where $V_{ref}$ is a common mode voltage level, $\alpha$ is a non-zero constant, and $V_{DD}$ is a power supply voltage.

27 Claims, 2 Drawing Sheets

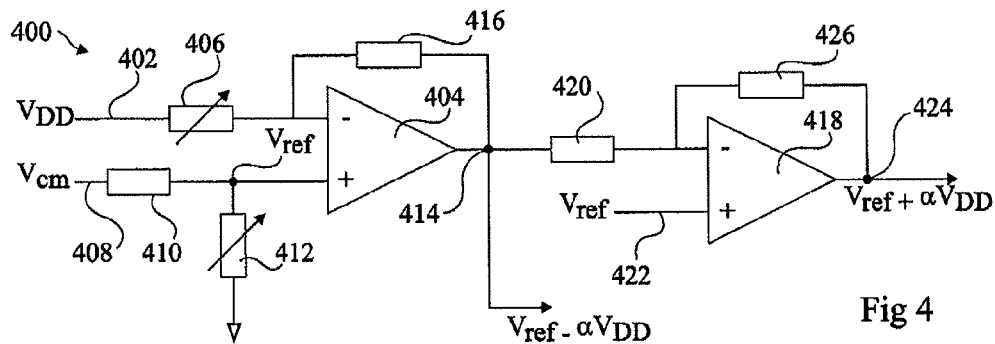
Fig 4
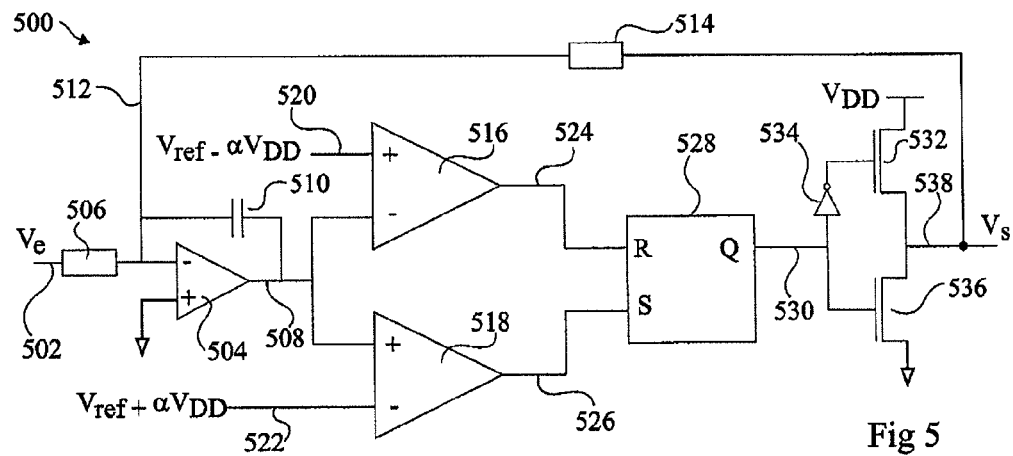
Fig 5
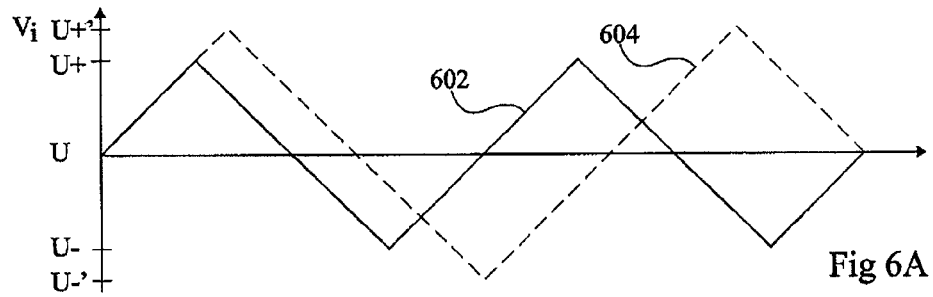
Fig 6A
Fig 6B
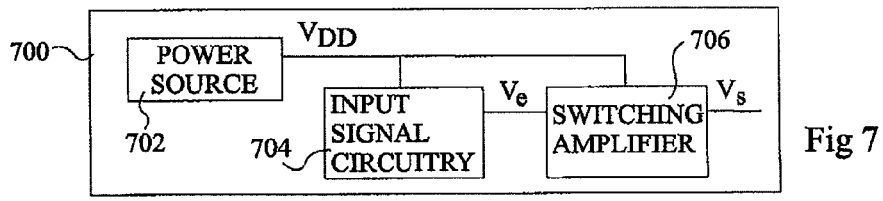
Fig 7

SWITCHING AMPLIFIER

CROSS REFERENCE TO RELATED APPLICATIONS

This application is a continuation of prior application Ser. No. 12/393,524, filed Feb. 26, 2009, which application claims the priority benefit of European patent application number 08300125.5, filed on Feb. 29, 2008, entitled "SWITCHING AMPLIFIER," which applications are hereby incorporated by reference to the maximum extent allowable by law.

BACKGROUND OF THE INVENTION

1. Field of the Invention

The present invention relates to an amplifier and in particular to an amplifier comprising one or more switches controlled by a hysteresis block.

2. Discussion of the Related Art

Switching amplifiers, such as class D audio amplifiers, are amplifiers that generate an output voltage by switching an output node between a supply voltage and a ground voltage. The duration of the pulses during which the output node is coupled to the supply voltage determines the output voltage level. This is controlled by a feedback loop that drives the switches.

It has been proposed to provide a hysteresis stage in the feedback loop for controlling the switches.

It is often an aim when designing such amplifiers to minimize noise and distortion at the output node. However, known designs that use hysteresis stages tend to have poor power supply rejection ratio (PSRR) meaning the effect of ripples in the power supply is relatively high on the output voltage. There is thus a need for a switching amplifier with a good PSRR.

SUMMARY OF THE INVENTION

It is one aim of embodiments of the present invention to at least partially address one or more needs in the prior art.

According to one aspect of the present invention, there is provided an amplifier comprising at least one switch controlled by an output voltage of a hysteresis block, wherein the hysteresis block is adapted to receive a low threshold voltage, a high threshold voltage and an input voltage signal based on an integration of an error signal, the hysteresis block being arranged to change the output voltage from a first value to a second value when the input voltage signal is higher than the high threshold voltage and to change the output voltage from the second value to the first value when the input voltage signal is lower than the low threshold voltage, and wherein the low threshold voltage is equal to a reference voltage level minus a supply voltage level, and the high threshold voltage is equal to the reference voltage level plus the supply voltage level.

According to an embodiment of the present invention, the low threshold voltage is equal to $V_{ref}-\alpha V_{DD}$ and the high threshold voltage is equal to $V_{ref}+\alpha V_{DD}$, where $V_{ref}$ is the reference voltage level, $\alpha$ is a non-zero constant, and $V_{DD}$ is a power supply voltage.

According to another embodiment of the present invention, the amplifier further comprises an integrator coupled to the hysteresis block to provide the input voltage signal; a power stage comprising the switches and coupled to receive the output voltage; and adder circuitry arranged to receive an input signal of the amplifier and an output voltage of the power stage, and to provide the error signal to an input of the integrator, the error signal based on the input signal and the output voltage.

According to another embodiment of the present invention, the hysteresis block comprises a first comparator for comparing said input voltage signal to the high threshold voltage and a second comparator for comparing the input voltage signal to the low threshold voltage.

According to another embodiment of the present invention, the hysteresis block further comprises an SR flip-flop adapted to be set by the output of one of the first and second comparators and reset by the output of the other of the first and second comparators.

According to another embodiment of the present invention, the amplifier further comprises a class D amplifier coupled to receive the output voltage of the hysteresis block, the class D amplifier comprising the switches.

According to another embodiment of the present invention, the amplifier further comprises circuitry adapted to generate the high and low threshold voltages, the circuitry comprising at least one variable resistance for allowing the supply voltage level to be adjusted.

According to a further aspect of the present invention, there is provided an electronic device, or a mobile communications device comprising the above amplifier.

According to yet a further aspect of the present invention, there is provided a method of controlling a power stage of an amplifier comprising: performing integration on an error signal to generate an integrated signal, the error signal being based on an input signal to be amplified and the output voltage of the power stage; comparing by a hysteresis block the integrated signal with a high threshold voltage and a low threshold voltage, and generating an output signal that changes from a first value to a second value if the integrated signal is higher than the high threshold voltage and changes from the second value to the first value if the integrated signal is lower than the low threshold voltage, wherein said low threshold voltage is equal to $V_{ref}-\alpha V_{DD}$ and said high threshold voltage is equal to $V_{ref}+\alpha V_{DD}$, where $V_{ref}$ is a common mode voltage level, $\alpha$ is a constant, and $V_{DD}$ is a power supply voltage.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings.

FIG. 4 illustrates circuitry for generating hysteresis threshold values according to an embodiment of the present invention;

FIG. 5 illustrates a switching amplifier according to a further embodiment of the present invention;

FIGS. 6A and 6B are timing diagrams illustrating the output of integrator and hysteresis blocks according to an embodiment of the present invention; and FIG. 7 illustrates a electronic device comprising a switching amplifier according to embodiments of the present invention.

DETAILED DESCRIPTION

Figure 1:
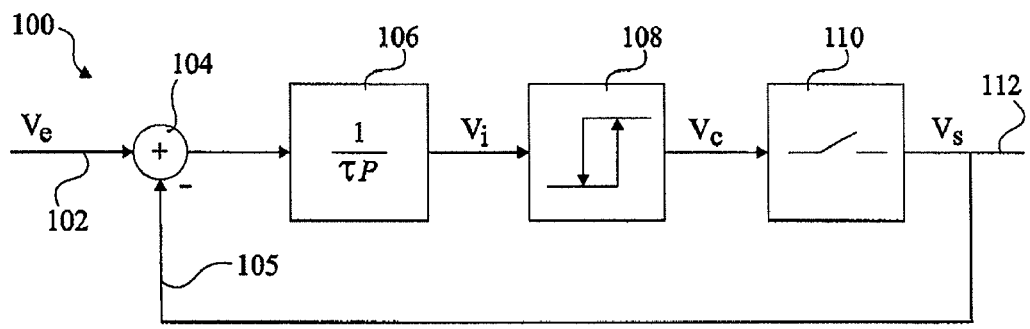
FIG. 1 illustrates a switching amplifier using sliding mode control.

FIG. 1 illustrates a switching amplifier 100 according to one embodiment comprising an input line 102 for receiving an input signal $V_e$. Line 102 is coupled to an adder block 104, which subtracts a value received from a feedback line 105, and passes the output to an integrator 106. Integrator 106 performs an integration $1/\tau p$ of the input signal with a constant of integration $\tau$ and wherein p is the laplace variable.

The integrated signal $V_i$ at the output of integrator 106 is provided to a hysteresis block 108, which outputs a high or low voltage based on high and low threshold levels. In particular, when the output $V_c$ of the hysteresis block is at the low voltage level, it changes to the high voltage level when the input signal $V_i$ goes higher than the high threshold, and when the output $V_c$ is at the high voltage level, it goes to the low voltage level when the input signal $V_i$ goes lower than the low threshold.

The signal $V_c$ is provided to a power stage 110 of the amplifier, which comprises switches controlled by signal $V_c$, known as a class D amplifier. The switches in the power stage 110 control when an output node 112 is coupled to a supply voltage level or a ground voltage level. The output signal $V_s$ therefore comprises pulses having durations depending on the control signal $V_c$, and its duty cycle can thus be controlled. Node 112 is coupled via feedback line 105 to adder 104.

The switching frequency $f_s$ of the switches that generates the pulsed output voltage $V_s$ is generally chosen to be much higher than the frequency band of any information contained in the signal, such that this can be filtered out resulting in a clean signal containing the information.

Figure 2:
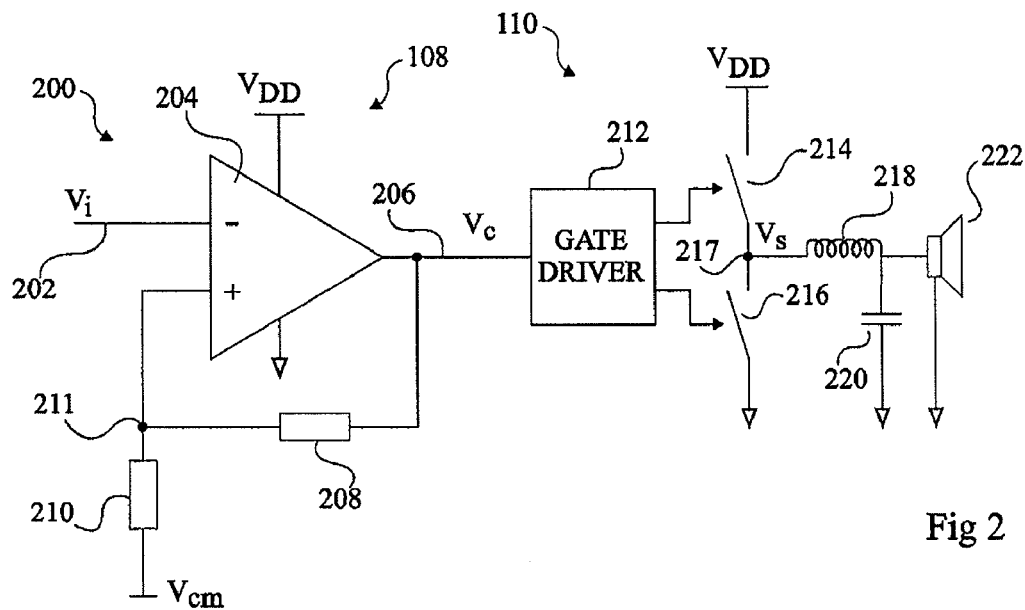
FIG. 2 illustrates the hysteresis and power stages of the switching amplifier of FIG. 1 in more detail.

FIG. 2 illustrates circuitry 200 that has been proposed for providing the hysteresis block 108 and the power stage 110 of the switching amplifier of FIG. 1.

The output $V_i$ of the integrator is provided on line 202 to the negative input of a differential amplifier 204, which has supply voltage inputs coupled to a supply voltage level $V_{DD}$, for example at 3.6 V, and a ground voltage level, which is, for example, 0 V. The output $V_c$ of the operational amplifier 204 is coupled to a node 206, which is in turn coupled to a common mode voltage level $V_{cm}$ via resistors 208 and 210 coupled in series. Common mode voltage $V_{cm}$ is for example a clean voltage level, for example halfway between the supply voltage level and the ground voltage level. A node 211 between resistors 208 and 210 is coupled to the positive input of the operational amplifier 204.

Node 206 is coupled to a gate driver block 212 of the power stage 110, which generates signals for controlling a pair of switches 214, 216 based on signal $V_c$. Switches 214, 216 are coupled via their main current terminals between the supply voltage level $V_{DD}$ and a ground voltage level. A node 217 between switches 214, 216 provides an output signal $V_s$, which in this example is filtered by an inductor 218 and a capacitor 220, inductor 218 being coupled in series between node 217 and an output load 222, and capacitor 220 being coupled in parallel with the output load 222 to ground. In the example of FIG. 2, the output load is an audio speaker.

In operation, the threshold levels of the hysteresis block are determined by the voltage at node 211, which depends on the output voltage $V_c$ of the operational amplifier 204. In particular, when the output voltage $V_c$ of the amplifier 204 is at the supply voltage level $V_{DD}$, the voltage at node 211, and thus the high threshold level $U_+$ is equal to:

$$U_+ = K_1 V_{DD} + K_2 V_{cm}$$

wherein $K_1$ is equal to $R_1/(R_1+R_2)$ and $K_2$ is equal to $R_2/(R_1+R_2)$, R1 being the resistance of resistor 210 and R2 being the resistance of resistor 208. When the output voltage of the amplifier is at the ground reference voltage level, for example at 0 V, the voltage at node 211, and thus the low threshold $U_-$ is:

$$U_- = K_2 V_{cm}$$

Thus the average voltage U between the high and low thresholds $U_+$ and $U_-$ is equal to:

$$U = K_2 V_{cm} + K_1 V_{DD}/2$$

The term containing $V_{DD}$ necessitates a high dependence between the switching of the output voltage $V_c$ of the hysteresis block 108 and the supply voltage $V_{DD}$, leading to a poor PSRR of the amplifier. In particular, the PSRR due to the hysteresis block 108 can be determined as:

$$PSRR = 20 \log(\pi V_e (V_{DD} - V_e) f_p / V_{DD}^2 f_s)$$

where $V_e$ is the input voltage of the integrator of the switching amplifier, $f_s$ is the switching frequency, and $f_p$ is the frequency of a voltage ripple on the supply voltage $V_{DD}$. Assuming $V_{DD}=3.6$ V, $V_e=V_{DD}/2$, $f_s=1$ MHz and $f_p=217$ Hz, the PSRR is approximately 75 dB, which is insufficient in many applications.

Figure 3:
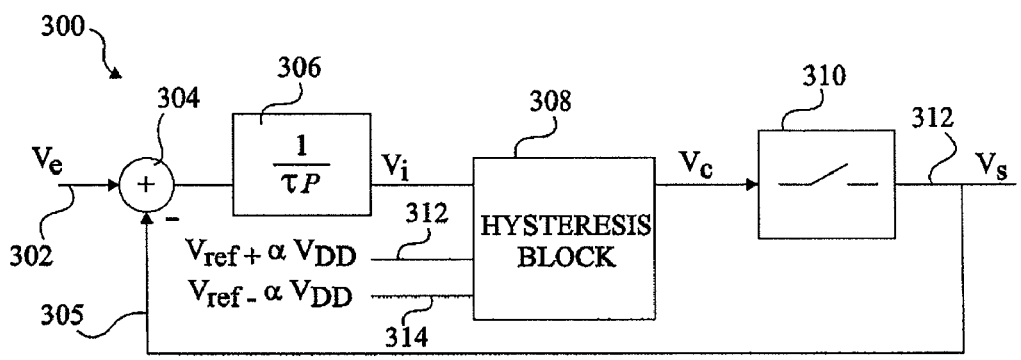
FIG. 3 illustrates an amplifier according to an embodiment of the present invention.

FIG. 3 illustrates an amplifier 300 comprising an input line 302 receiving an input voltage signal $V_e$, coupled to an adder 304, which subtracts the signal received on a feedback line 305 from signal $V_e$. The output of adder 304 is coupled to an integrator 306, which performs an integration $1/\tau p$ having a constant of integration $\tau$ and wherein p is the laplace variable. The output signal $V_i$ of the integrator is provided to a hysteresis block 308, which in this embodiment also receives a high threshold voltage on line 312 equal to $V_{ref} + \alpha V_{DD}$, and a low threshold voltage on line 314 equal to $V_{ref} - \alpha V_{DD}$, where $V_{ref}$ is a reference voltage based on a common mode voltage level, which is a clean voltage reference, $V_{DD}$ is a supply voltage and $\alpha$ is a constant, but may be adjusted in some embodiments as described in more detail below. A difference between the supply voltage $V_{DD}$ and the reference voltage $V_{ref}$ is that while a current can generally be supplied by $V_{DD}$ to supply a load, Vref is a reference voltage generally only used as a reference from which no current or a very little current is drawn. By way of example, assuming $V_{ref}$ is equal to 1.8 V, $V_{DD}$ is equal to 3.6 V, and $\alpha$ is equal to 0.2, the low threshold voltage is 1.08 V and the high threshold 2.52 V. $\alpha$ is preferably in a range 0.05 to 0.2.

The hysteresis block 308 generates an output signal $V_c$, which, as with hysteresis block 108, has either a high or low value. As with hysteresis block 108, when the output is low and the input voltage $V_i$ is greater that the high threshold voltage, the output goes high, while when the output is high, and the input voltage $V_i$ is lower than the low threshold voltage, the output goes low.

The output signal $V_c$ of the hysteresis block 308 is provided to a power stage 310 comprising switches, and provides the output voltage $V_s$ of the amplifier on line 312. The output line 312 is also coupled to adder 304 via feedback line 305.

By providing the threshold values $U_+$ and $U_-$ equal to a reference voltage plus or minus respectively a multiple of the supply voltage, the mean threshold U is the reference voltage $V_{ref}$, while the difference between the thresholds $\Delta_U = (U_+ - U_-)/2$ is $\alpha V_{DD}$. This means that ripples in the supply voltage affect the high and low thresholds by the same amount in opposite directions, cancelling the effect of the ripple, while as the average value of the thresholds does not change, the overall duty cycle of the output pulses will not be affected by the ripple.

FIG. 4 illustrates an example of circuitry 400 for generating the high and low thresholds provided on lines 312 and 314 to the hysteresis block. Circuitry 400 comprises an input line 402 for receiving the supply voltage $V_{DD}$, which could be a battery voltage, provided by one or more batteries or a different supply voltage. Line 402 is coupled to the negative input terminal of an operational amplifier 404 via a variable resistor 406. An input line 408 is also provided for receiving a common mode voltage $V_{cm}$, which is a clean voltage reference that is, for example, generated by a band gap cell. Input line 408 is coupled to the positive input node of the operational amplifier 404 via a resistor 410. The positive input terminal of operational amplifier is further coupled to a ground reference voltage via a variable resistor 412. The voltage at the positive input node of operational amplifier 404 is the reference voltage $V_{ref}$, which, in this example, is between $V_{cm}$ and the ground reference voltage.

The negative input terminal of operational amplifier 404 is coupled to the output terminal 414 of the operational amplifier via a resistor 416. The output node 414 provides the low threshold $U_- = V_{ref} - \alpha V_{DD}$. Node 414 is coupled to the negative input terminal of an operational amplifier 418 via a resistor 420. The positive input terminal of operational amplifier 418 is coupled to a line 422 for receiving the reference voltage $V_{ref}$. The negative input terminal of the operational amplifier is further coupled to the output terminal 424 of the operational amplifier 418 via a resistor 426. Resistors 420 and 426 for example have the same resistance as each other, such that the gain provided by operational amplifier 418 is −1. Output node 424 provides the high threshold $U_+ = V_{ref} + \alpha V_{DD}$.

The value of $\alpha$ can be adjusted by variable resistor 406. In particular, assuming resistor 406 has a resistance $R_1$ and resistor 416 a resistance $R_2$, $\alpha$ can be determined as being equal to R2/R1. The value of $\alpha$ can be used to control the switching frequency of the switching amplifier as will be described in more detail below.

Furthermore, the voltage $V_{ref}$ can be adjusted by varying resistor 412. Assuming resistor 410 has a resistance R1, while resistor 412 has a resistance R2, it follows that $V_{ref} = V_{cm} R2/(R1+R2)$.

FIG. 5 illustrates a switching amplifier 500 according to one example.

As illustrated, an input line 502 is provided for receiving an input voltage signal $V_e$ to be amplified. Line 502 is coupled to the negative input terminal of an operational amplifier 504 via a resistor 506. Furthermore, the output node 508 of the operational amplifier 504 is coupled to the negative input terminal via a capacitor 510, and the positive input terminal of the operational amplifier 504 is coupled to a ground reference voltage. The operational amplifier 504, resistor 506 and capacitor 510 provide the function of the integrator, wherein the value of capacitor 510 and resistor 506 provide the integration constant τ. For example, capacitor 510 has a capacitance of 1 pF, while resistor 506 has a resistance of 1 M Ohms, although these values will depend on the requirements of the amplifier, such as the switching frequency.

The negative input terminal of operational amplifier 504 is also coupled to a feedback line 512 comprising a feedback resistor 514.

The output node 508 of operational amplifier 504 is coupled to the negative input terminal of operational amplifier 516 and to the positive input terminal of operational amplifier 518. Operational amplifier 516 has its positive input terminal coupled to a line 520 for receiving the low threshold voltage $U_- = V_{ref} - \alpha V_{DD}$, while operational amplifier 518 has its negative input terminal coupled to a line 522 for receiving the high threshold voltage $U_+ = V_{ref} + \alpha V_{DD}$, the high and low threshold voltages, for example, being generated by the circuitry of FIG. 4. The output nodes 524 and 526 of operational amplifiers 516 and 518 respectively are coupled to the R and S inputs respectively of an RS flip-flop 528, which has its Q output coupled to a line 530. The combination of operational amplifiers 516, 518 and SR flip-flop 528 provide the hysteresis block of the switching amplifier.

Line 530 is coupled to the gate node of a transistor 532 via an inverter 534, and to the gate node of a transistor 536, transistors 532 and 536 for example being power MOSFETs (metal oxide semiconductor field effect transistors). Transistors 532 and 536 are coupled in series via their main current terminals between a supply voltage terminal and a ground reference terminal. Transistors 532, 536 and inverter 534 provide the power stage of the switching amplifier, and a node 538 between the transistors provides the output voltage signal $V_s$ of the switching amplifier. Node 538 is coupled to the negative input terminal of operational amplifier 504 via the feedback resistor 514. Node 538 is, for example, coupled to a load (not shown in FIG. 5), which in the case of audio applications could be a speaker, such as speaker 22 of FIG. 2, coupled via filtering circuitry such as inductor 218 and capacitor 220 connected as shown in FIG. 2.

In operation, the voltage signal at node 508 is the signal $V_i$, which represents an integration of an error signal based on the input voltage $V_e$ minus the voltage Vs at the output of the switch amplifier. The output voltage $V_s$ in this example is at one of the ground reference and the supply voltage. Assuming that $V_e$ is equal to 1.8 V and the output is initially at the ground reference, which is, for example, at 0 V, then the integration is performed on a constant voltage of 1.8 V, meaning the voltage at node 508 decreases relatively linearly. During this period, outputs of operational amplifiers 518 and 520 are low as the voltage at 508 is not lower than $V_{ref} - \alpha V_{DD}$, nor higher than $V_{ref} + \alpha V_{DD}$. However, when the voltage $V_i$ falls below $V_{ref} - \alpha V_{DD}$, the output of operational amplifier 516 will go high, causing the Q output of SR flip-flop 528 to go low, and thus transistor 532 to turn on, and transistor 536 to turn off, coupling the output node 538 to the supply voltage. The integration is then performed on a constant voltage of −1.8 V, the voltage $V_i$ increases relatively linearly. When voltage $V_i$ exceeds $V_{ref} + \alpha V_{DD}$, the output of operational amplifier 518 will go high, causing the Q output of SR flip-flop 528 to go high, and transistor 532 to turn off and transistor 536 to turn on, coupling the output node 538 to the ground reference voltage again.

FIG. 6A illustrates the voltage $V_i$ when the high and low threshold voltages are $U_+$ and $U_-$ respectively, and assuming an input voltage $V_e$ at half the supply voltage. As illustrated by the solid line 602, the voltage $V_i$ increases linearly until it reaches the high threshold $U_+$, and then fall linearly until it reaches the low threshold $U_-$. The dashed line in FIG. 6A illustrates the effect of a positive voltage ripple of the supply voltage. As illustrated, the high threshold increases to $U_+'$, while the low threshold decreases to $U_-'$, but the ratio between the time that voltage $V_i$ increases and the time that it decreases remains the same.

FIG. 6B illustrates the signal $V_s$ resulting from the signal $V_i$ of FIG. 6A. The solid line 606 illustrates the case when the high and low threshold voltages are $U_+$ and $U_-$ respectively, while dashed line 608 illustrates the case that the high and low threshold voltages become $U_+'$ and $U_-'$ respectively due to a positive voltage ripple on the supply voltage. As illustrated, the duty cycle of the solid signal and that of the dashed signal during the period illustrated are equal. Thus, the distance between the high and low thresholds is proportional to changes in the supply voltage, while the middle point between the high and low thresholds is unaffected by such a change, leading to a duty cycle relatively independent of changes in the supply voltage.

FIG. 7 illustrates an electronic device 700 comprising a power source 702 that provides a supply voltage $V_{DD}$. Power source 702 is, for example, a battery, power supply unit, or other power source, and $V_{DD}$ is a DC voltage level. $V_{DD}$ is provided to input signal circuitry 704 that provides an input signal $V_e$, and to an amplifier 706, which amplifies the input signal $V_e$ by a gain to generate an output signal $V_s$. Amplifier 706 is, for example, the amplifier of FIG. 3 or 5, which is, for example, a switching amplifier providing a gain which may be lower or greater than 1.

Electronics device 700 is, for example, a mobile telephone, MP3 player, GPS navigator, media player, laptop or desktop PC, set-top box, radio receiver, digital camera, or other electronic device that comprises an amplifier having a power stage based on switches, such as a switching amplifier. The input signal $V_e$ could be an audio signal, and the switching amplifier used to amplify the audio signal to drive internal or external speakers or headphones. Alternatively, the amplifier as described herein could be used as a DC-DC converter, to provide a DC voltage level based on a reference DC voltage $V_e$.

Advantageously, embodiments of the switching amplifier as described herein provide improved PSRR. In particular, the PSRR is only a function of the switching frequency, and can in theory be infinite for an infinite switching frequency. In practice, it has been found that for a switching frequency of 200 kHz, a PSRR greater than 80 dB can be achieved.

A further advantage of embodiments of the switching amplifier described herein is that because the error signal, in other words integral of the input voltage $V_e$ minus the output voltage Vs, is always between $U_-$ and $U_+$, the circuit is still stable.

A further advantage of embodiments of the switching amplifier described herein is that the variations in the switching frequency can be controlled in order to reduce interference with surrounding electronics. In particular, by controlling, for example, one or both of the variable resistors 406, 412, of the circuitry 400 of FIG. 4, the constant $\alpha$ can be varied, thus adjusting the high and low thresholds of the hysteresis block and adjusting the switching frequency. For example, in the case of audio data in the audio band of 20 Hz to 20 kHz, the switching frequency can for example be chosen to be around 200 kHz or more. In particular, the switching frequency $F_s$ can be determined as:

$$F_s = (1-M)^2/4\alpha\tau$$

wherein M is the index of modulation, $\alpha$ is the constant of the high and low threshold voltages as described above, and $\tau$ the constant of integration.

Having thus described illustrative embodiments of the invention, various alterations, modifications and improvements will readily occur to those skilled in the art.

For example, while examples of the circuitry of a switching amplifier have been provided in FIG. 5, it will be apparent that alternative circuits could be used. For example, the hysteresis function could be implemented in alternative ways.

While, in the various embodiments, the supply voltage $V_{DD}$ has been described as, for example, being a battery voltage, it will be apparent to those skilled in the art that the supply voltage could be from any power source, such a battery, power supply unit, solar cell, etc.

Furthermore, it will be apparent that while in the circuit of FIG. 4 variable resistors 406 and 412 have been provided, fixed resistors could be used, providing a fixed value of $\alpha$, or a resistor network comprising a plurality of resistors could be provided, and selection circuitry provided for selecting one or a combination of the resistors in the resistor network to provide these resistances. The latter embodiment would allow an amplifier to be customized by a customer such that the switching frequency has a desired frequency range, and thereby reduce possible interference with surrounding components.

While an example of the power stage comprising a class D amplifier comprising a pair of MOS transistors has been described, it will be apparent to those skilled in the art that other types of class D amplifiers or switches could be provided in the power stage.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier comprising:
   at least one switch controlled by an output voltage of a hysteresis block, and
   the hysteresis block, wherein
   the hysteresis block is adapted to receive a low threshold voltage, a high threshold voltage and an input voltage signal based on an integration of an error signal, the hysteresis block being arranged to change the output voltage of the hysteresis block from a first value to a second value when the input voltage signal is higher than the high threshold voltage and to change the output voltage from the second value to the first value when the input voltage signal is lower than the low threshold voltage, and wherein
   the low threshold voltage is equal to $V_{ref} - \alpha V_{DD}$, and the high threshold voltage is equal to $V_{ref} + \alpha V_{DD}$, where $V_{ref}$ is derived from a common mode voltage, $\alpha$ is a non-zero constant, and $V_{DD}$ is derived from a power supply voltage for the amplifier.

2. The amplifier of claim 1, further comprising:
   an integrator coupled to the hysteresis block to provide the input voltage signal;
   a power stage comprising the at least one switch and coupled to receive the output voltage of the hysteresis block; and
   adder circuitry arranged to receive an input signal for the amplifier and an output voltage of the power stage, and to provide the error signal to an input of the integrator, the error signal based on the input signal for the amplifier and the output voltage of the power stage.

3. The amplifier of claim 1, wherein the hysteresis block comprises a first comparator for comparing the input voltage signal to the high threshold voltage and a second comparator for comparing the input voltage signal to the low threshold voltage.

4. The amplifier of claim 3, wherein the hysteresis block further comprises an SR flip-flop adapted to be set by an output of one of the first and second comparators and reset by an output of the other of the first and second comparators.

5. The amplifier of claim 1, comprising a class D amplifier coupled to receive the output voltage of the hysteresis block, the class D amplifier comprising the at least one switch.

6. The amplifier of claim 1, further comprising circuitry adapted to generate the high and low threshold voltages, the circuitry comprising at least one variable resistance for allowing α to be adjusted.

7. An electronic device comprising the amplifier of claim 1.

8. A mobile communications device comprising the amplifier of claim 1.

9. A method of controlling a power stage of an amplifier comprising:
performing integration on an error signal to generate an integrated signal, the error signal being based on an input signal to be amplified and the output voltage of the power stage; and
comparing, in a hysteresis block, the integrated signal with a high threshold voltage and a low threshold voltage, and generating an output signal that changes from a first value to a second value if the integrated signal is higher than the high threshold voltage and changes from the second value to the first value if the integrated signal is lower than the low threshold voltage, wherein the low threshold voltage is equal to $V_{ref}-\alpha V_{DD}$ and the high threshold voltage is equal to $V_{ref}+\alpha V_{DD}$, where $V_{ref}$ is derived from a common mode voltage, α is a non-zero constant, and $V_{DD}$ is derived from a power supply voltage for the amplifier.

10. The amplifier of claim 1, further comprising circuitry adapted to generate the high and low threshold voltages, the circuitry comprising at least one variable resistance for allowing $V_{ref}$ to be adjusted.

11. A switching amplifier comprising:
a hysteresis block adapted to receive at least a first threshold signal and a second threshold signal; and
a switching power stage adapted to receive power from a power source and an output signal from the hysteresis block, wherein
the first threshold signal establishes a high threshold value for the hysteresis block and comprises $V_{ref}+\alpha V_{DD}$ and the second threshold signal establishes a low threshold value for the hysteresis block and comprises $V_{ref}-\alpha V_{DD}$, where $V_{ref}$ is a voltage value derived from a common mode voltage source, α is a selectable non-zero value, and $V_{DD}$ is voltage value derived from the power source.

12. The switching amplifier of claim 11, wherein the hysteresis block is further adapted to receive an input signal for the hysteresis block and change an output voltage of the hysteresis block from a first value to a second value when the input signal for the hysteresis block is higher than the high threshold value and to change the output voltage of the hysteresis block from the second value to the first value when the input signal for the hysteresis block is lower than the low threshold value.

13. The switching amplifier of claim 11, further comprising:
an integrator coupled to the hysteresis block to provide an input signal for the hysteresis block; and
adder circuitry arranged to receive an input signal for the switching amplifier and a signal representative of an output voltage of the switching power stage, and to provide an error signal to an input of the integrator, the error signal based on the input signal for the switching amplifier and the signal representative of the output voltage of the switching power stage.

14. The switching amplifier of claim 13, wherein the input signal for the switching amplifier comprises an audio signal.

15. The switching amplifier of claim 13, wherein the hysteresis block comprises a first comparator for comparing the input signal for the hysteresis block to the high threshold value and a second comparator for comparing the input signal for the hysteresis block to the low threshold value.

16. The switching amplifier of claim 15, wherein the hysteresis block further comprises an SR flip-flop adapted to be set by an output of one of the first and second comparators and reset by an output of the other of the first and second comparators.

17. The switching amplifier of claim 11, wherein the switching power stage comprises at least one switch adapted to change an output of the switch from a first state to a second state based upon an input signal to the at least one switch.

18. The switching amplifier of claim 17, wherein the at least one switch comprises at least one MOS transistor.

19. The switching amplifier of claim 11, wherein the switching power stage comprises a class D amplifier coupled to receive an output voltage of the hysteresis block.

20. The switching amplifier of claim 11, further comprising at least one variable resistance for selecting a value of α.

21. The switching amplifier of claim 11, further comprising at least one variable resistance for selecting a value of $V_{ref}$.

22. The switching amplifier of claim 11 integrated in and adapted to amplify a signal in an electronic device selected from the group consisting of: a mobile telephone, MP3 player, GPS navigator, media player, laptop personal computer, desktop personal computer, set-top box, radio receiver, digital camera, and DC-DC converter.

23. The switching amplifier of claim 11, wherein an output terminal of the switching power stage is adapted to activate at least one audio speaker.

24. A method controlling a switching power stage in a switching amplifier, the method comprising:
establishing a high threshold value for a hysteresis block using a first threshold signal input to the hysteresis block comprising $V_{ref}+\alpha V_{DD}$, where $V_{ref}$ is a voltage value derived from a common mode voltage source, α is a selectable non-zero value, and $V_{DD}$ is a voltage value derived from a power source for the switching power stage;
establishing a low threshold value for the hysteresis block using a second threshold signal input to the hysteresis block comprising $V_{ref}-\alpha V_{DD}$; and
providing an output from the hysteresis block to control the switching power stage.

25. The method of claim 24 further comprising:
receiving an input signal for the switching amplifier; and
providing an error signal to an integrator, wherein the error signal comprises a difference between the input signal for the switching amplifier and a signal representative of an output signal from the switching power stage; and
providing an output signal from the integrator to the hysteresis block.

26. The method of claim 25 further comprising driving, with the output signal from the switching power stage, at least one audio speaker circuit.

27. The method of claim 25 further comprising driving a component of an electronic device selected from the group consisting of: a mobile telephone, MP3 player, GPS navigator, media player, laptop personal computer, desktop personal computer, set-top box, radio receiver, digital camera, and DC-DC converter.

* * * * *